United States Patent
Shah

(10) Patent No.: US 7,188,418 B2
(45) Date of Patent: Mar. 13, 2007

(54) METHOD OF MAKING SPLIT FIN HEAT SINK

(75) Inventor: Ketan R. Shah, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 330 days.

(21) Appl. No.: 10/701,582

(22) Filed: Nov. 5, 2003

(65) Prior Publication Data

US 2004/0240182 A1    Dec. 2, 2004

Related U.S. Application Data

(62) Division of application No. 10/388,153, filed on Mar. 13, 2003, now Pat. No. 6,714,415.

(51) Int. Cl.
*B21D 53/02* (2006.01)
*B21D 53/06* (2006.01)

(52) U.S. Cl. .............. 29/890.05; 29/890.03; 29/890.046; 72/68

(58) Field of Classification Search ........... 29/890.03, 29/890.046, 890.05; 72/68; 361/697
See application file for complete search history.

(56) References Cited

U.S. PATENT DOCUMENTS

| | | | |
|---|---|---|---|
| 3,466,909 A * | 9/1969 | Weber | 72/68 |
| 4,187,711 A * | 2/1980 | Lavochkin et al. | 72/256 |
| 4,369,838 A | 1/1983 | Asanuma et al. | |
| 5,597,034 A * | 1/1997 | Barker et al. | 165/80.3 |
| 5,661,638 A * | 8/1997 | Mira | 361/697 |
| 5,794,685 A * | 8/1998 | Dean | 165/121 |
| 6,179,046 B1 * | 1/2001 | Hwang et al. | 165/80.3 |
| 6,382,306 B1 | 5/2002 | Hsu | |
| 6,633,484 B1 * | 10/2003 | Lee et al. | 361/697 |
| 6,705,144 B2 * | 3/2004 | Pollard et al. | 72/68 |
| 2001/0010264 A1* | 8/2001 | Kuo | 165/185 |
| 2002/0036893 A1* | 3/2002 | Cho et al. | 361/709 |

FOREIGN PATENT DOCUMENTS

| | | |
|---|---|---|
| DE | 296 18 792 U1 | 6/1997 |
| EP | 1 117 130 A2 | 7/2001 |
| JP | 53-132452 * | 11/1978 |
| WO | WO 02/41395 A2 | 5/2002 |

OTHER PUBLICATIONS

"PCT Notification of Transmittal of the International Search Report and the Written Opinion of the International Searching Authority, or the Declaration", dated Jul. 29, 2004 for PCTUS2004/003153, 11pgs.

* cited by examiner

*Primary Examiner*—Marc Jimenez
(74) *Attorney, Agent, or Firm*—Buckley, Maschoff & Talwalkar LLC

(57) ABSTRACT

A heat sink for dissipating heat from an electronic component includes a core and a plurality of fins extending outwardly from the core. The fins may be at least partially curved. Each fin may split into a plurality of tines that extend away from the core.

22 Claims, 4 Drawing Sheets

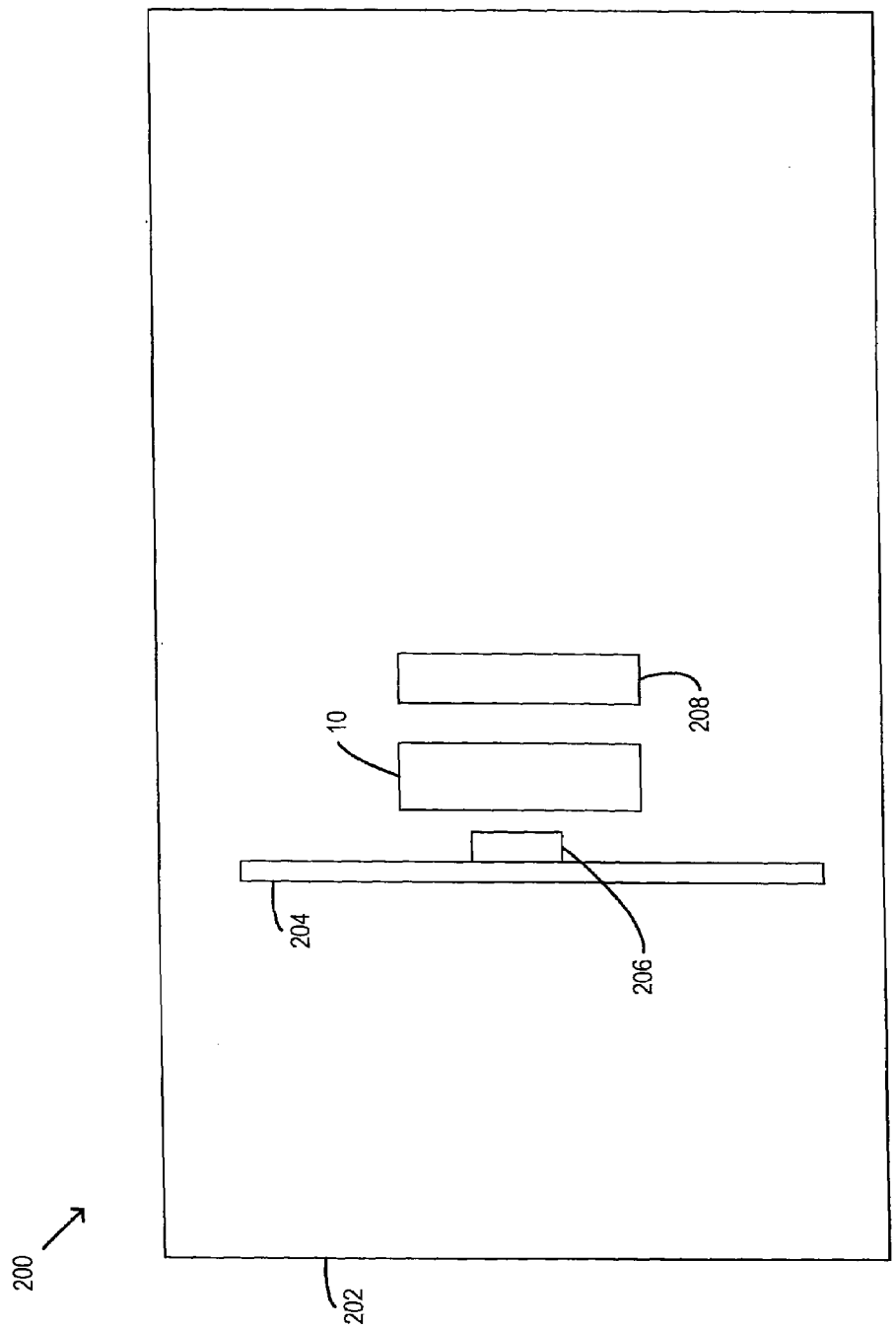

METHOD OF MAKING SPLIT FIN HEAT SINK

CROSS REFERENCE TO RELATED APPLICATION

This is a divisional of prior U.S. patent application Ser. No. 10/388,153, filed Mar. 13, 2003 now U.S. Pat. No. 6,714,415.

BACKGROUND

It is known in electronic equipment to provide a heat sink that is thermally coupled to an electronic component such as a microprocessor to prevent the electronic component from overheating. It has been proposed to form heat sinks having a central core and a large number of straight or curved fins that extend outwardly from the core.

It may be expected that continued development of microprocessors or other electronic components may increase the demands on heat sinks and may make more efficient heat sinks particularly desirable.

BRIEF DESCRIPTION OF THE DRAWINGS

FIG. 4 is a schematic, partially-exploded side view of an electronic system according to some embodiments.

DETAILED DESCRIPTION

Figure 1:
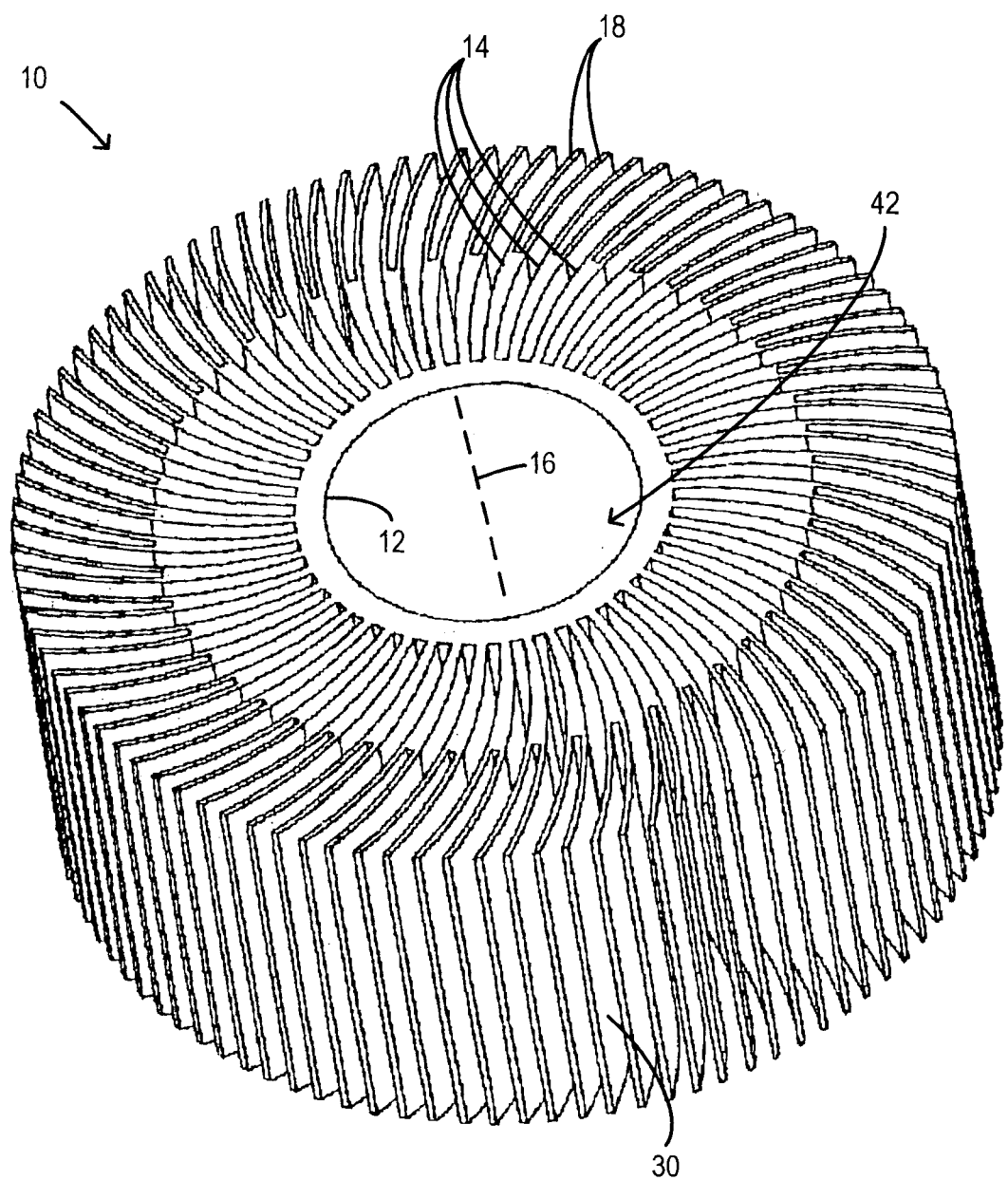
FIG. 1 is a perspective view of a heat sink according to some embodiments.
Figure 2:
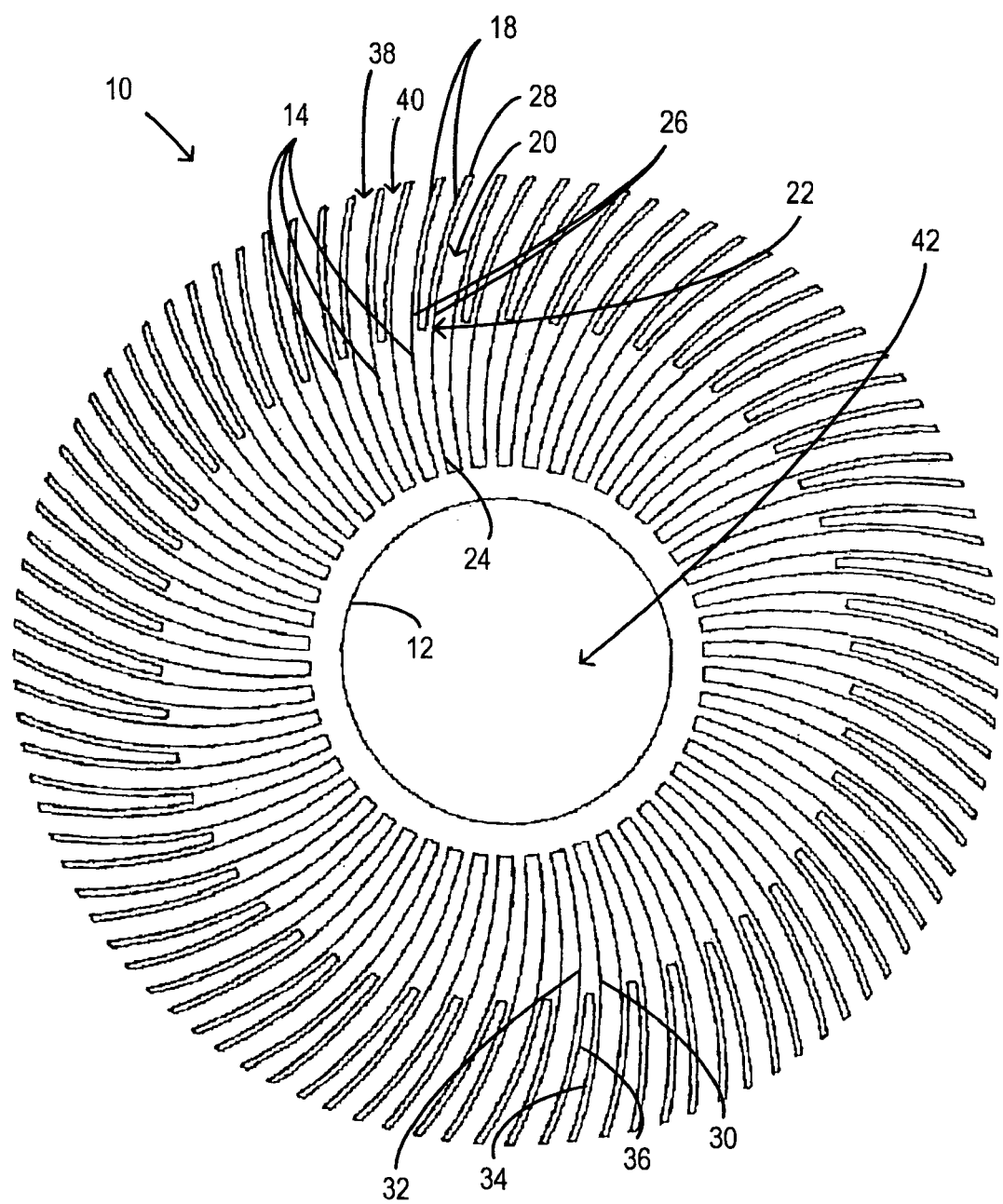
FIG. 2 is a plan view of the heat sink of FIG. 1.

FIG. 1 is a perspective view of a heat sink 10 according to some embodiments. FIG. 2 is a plan view of the heat sink 10. The heat sink 10 includes a generally cylindrical core 12, and curved fins 14 which extend outwardly from the core 12. The core 12 has a central axis which is indicated by a dashed line 16 in FIG. 1. The curvature of the fins 14 is such that the respective axes of curvature of the fins 14 are parallel to the central axis 16.

Each of the fins 14 splits so as to be divided into a pair of tines 18 at an outward portion 20 of the respective fin 14. The splitting of each fin 14 into its tines 18 occurs at a furcation point 22 that may, for example, be about halfway along the length of the fin 14. Each fin 14 has a root 24 which emerges in an outward direction from the core 12, and each tine 18 has a root 26 which emerges in an outward direction from the furcation point 22 of the tine's respective fin 14. Each tine 18 also has a tip 28 at an opposite end of the tine from the tine root 26. For each fin 14, the tips 28 of its respective tines 18 may also be considered dual tips of the fin itself. The length of the fin 14 may be considered the curvilinear distance along the fin 14 from the fin's root 24 to one or the other of the tips 28 its two tines 18. In some embodiments, as illustrated in FIGS. 1 and 2, the furcation point 22 of each fin 14 may be substantially half-way between the root 24 of the fin 14 and the tips 28 of the tines 18 of the fin 14. Consequently, in some embodiments, the lengths of the tines 18 may be substantially 50% of the overall length of the fins 14. In other words, the ratio of the length of the tines 18 to the length of the fins 14 may be substantially 0.5:1.

Each fin 14 has a convex surface 30 which extends from the root 24 of the fin 14 to the tip 28 of one of the tines 18 of the fin 14. Each fin 14 also has a concave surface 32 which is opposite to the convex surface 30 and which extends from the root 24 of the fin 14 to the tip 28 of the other one of the tines 18 of the fin 14. The tine 18 which shares the convex surface 30 of the fin 14 has an inner surface 34 which is opposite to a radially outward portion of the convex surface 30. The inner surface 34 of the convex-surface-sharing tine is a concave surface. The tine 18 which shares the concave surface 32 of the fin 14 has an inner surface 36 which is opposite to a radially outward portion of the concave surface 32. The inner surface 36 of the concave-surface-sharing tine is a convex surface.

It will be observed that an adjacent pair of the fins 14 defines a curved gap 38 between the pair of fins. Also the two tines of a particular fin 14 define therebetween a curved gap 40. The length of the gap 38 in the generally radial direction extending outwardly from the core 12 is essentially the same as the length of the fins 14. The length of the gap 40 in the generally radial direction extending outwardly from the furcation point 22 of the respective fin 14 is essentially the same as the length of the tines 18. Accordingly, in the example embodiment illustrated in FIGS. 1 and 2, the length of the gap 40 is substantially one-half the length of the gap 38.

In some embodiments, all the fins 14 have substantially the same length as each other. In some embodiments, all the tines 18 have substantially the same length as each other. In some embodiments, all the gaps 38 defined by pairs of adjacent fins 14 have substantially the same length as each other. In some embodiments, all the gaps 40 defined between the two tines 18 of one fin 14 have substantially the same length as each other.

In some embodiments, the number of fins 14 may be 50 in all, as illustrated in FIGS. 1 and 2. Alternatively, the number of fins 14 may be varied. For example, the number of fins may be in the range 30–80.

In some embodiments, the number of tines formed in each fin is two, as illustrated in FIGS. 1 and 2. Alternatively, the number of tines formed in each fin may be three or more.

In some embodiments, all of the fins are divided into the same number of tines (e.g., two in the example embodiment illustrated in FIGS. 1 and 2). Alternatively, the number of tines may vary from one fin to another. For example, some fins may have two tines while other fins have three or more tines. As another alternative, some fins may split into two or more tines, while other fins do not split.

In some embodiments, the fins 14 are curved all along their length, as illustrated in FIGS. 1 and 2. Alternatively, the fins may be curved only along part of their length, and may be straight along the rest of their length. For example, the fins may be curved up to their furcation points 22 and may be straight in the region of the tines of each fin. As another alternative, the fins may be straight up to their furcation points and may be curved in the region of the tines of each fin. If the fins have both curved and straight portions, the point of transition between the two portions need not be at the furcation point. If the fins are not curved all along their length, then the non-curved portions may be bent. That is, the non-curved portions may include two or more straight sections that form one or more angles. As other alternatives, the fins may be entirely straight, or may be bent without any curved portion, or may branch outwardly without any curve.

In some embodiments, as illustrated in FIGS. 1 and 2, the ratio of the length of the tines to the total length of the fins may be substantially 0.5:1. That is, in the illustrated example, the length of the tines is substantially 50% of the total length of the fins. However, this ratio or percentage may be changed in other embodiments. For example the ratio of the length of the tines to the total length of the fins may be in the range 0.3:1 to 0.7:1. That is, the length of the tines may be in the range of 30% to 70% of the length of each fin. The tines need not all be of the same length, and the fins need not all be of the same length.

In the example embodiment illustrated in FIGS. 1 and 2, the core 12 has a circular (cylindrical) configuration. Alternatively, the core 12 may have other configurations, including an elliptical configuration or a rectangular configuration. As another alternative, the core may be shaped as a "semi-rectangle", i.e., a four-sided shape with slightly curved sides and rounded corners.

In some embodiments, the heat sink 10 may have the following dimensions: The height may be substantially 37 mm and the width ("wingspan") may be substantially 90 mm. The inner diameter of the core 12 may be substantially 30 mm and the thickness of the core wall may be substantially 2.5 mm. The total length of each fin 14 may be substantially 27 mm. (Assuming that the length of the tines is substantially 50% of the length of the fins, the length of the tines may be substantially 13.5 mm.) The thickness of the fins 14 may be substantially 1.0 to 1.3 mm. The thickness of the tines may be substantially 0.6 to 0.7 mm. The radius of curvature of the fins may be substantially 20 mm.

In other embodiments, one or more of the dimensions given above may be changed.

The thickness of the fins at their respective roots, which may be in the range given above, may be thicker than in conventional radial fin heat sinks, reflecting that each fin root of the embodiment of FIGS. 1 and 2 serves a pair of tines capable of dissipating more heat than a conventional un-split fin.

The configuration of the heat sink 10 may be substantially uniform in the vertical direction to allow the heat sink to be formed by an extrusion process as described below. That is, the configuration of the heat sink 10 may be such that all cross-sections of the heat sink 10 taken normal to the central axis 16 are identical to each other.

The fins 14 may be configured such that the gaps 38 defined therebetween have a width that is substantially unchanged from the tips 28 of the tines 18 to the roots 24 of the fins 14. This may be accomplished by branching or spreading of the tines 18. Because of the substantially unchanging width of the gaps 38 along their lengths, the air pressure drop along the gap may be lower than in conventional radial fin heat sinks, thereby allowing air to more efficiently reach the fin roots 24 of the heat sink illustrated in FIGS. 1 and 2. Since the roots are the most efficient part of the fin from the point of view of heat exchange, the overall heat-exchanging efficiency of the heat sink 10 may be enhanced.

The heat-exchanging efficiency of the heat sink 10 is further enhanced by the additional surface area provided by the splitting of the fins 14 into the tines 18.

The core 12 is illustrated as being hollow and as defining a central cylindrical cavity 42. Alternatively, the cavity 42 may be omitted so that the core is a substantially solid cylinder.

Figure 3:
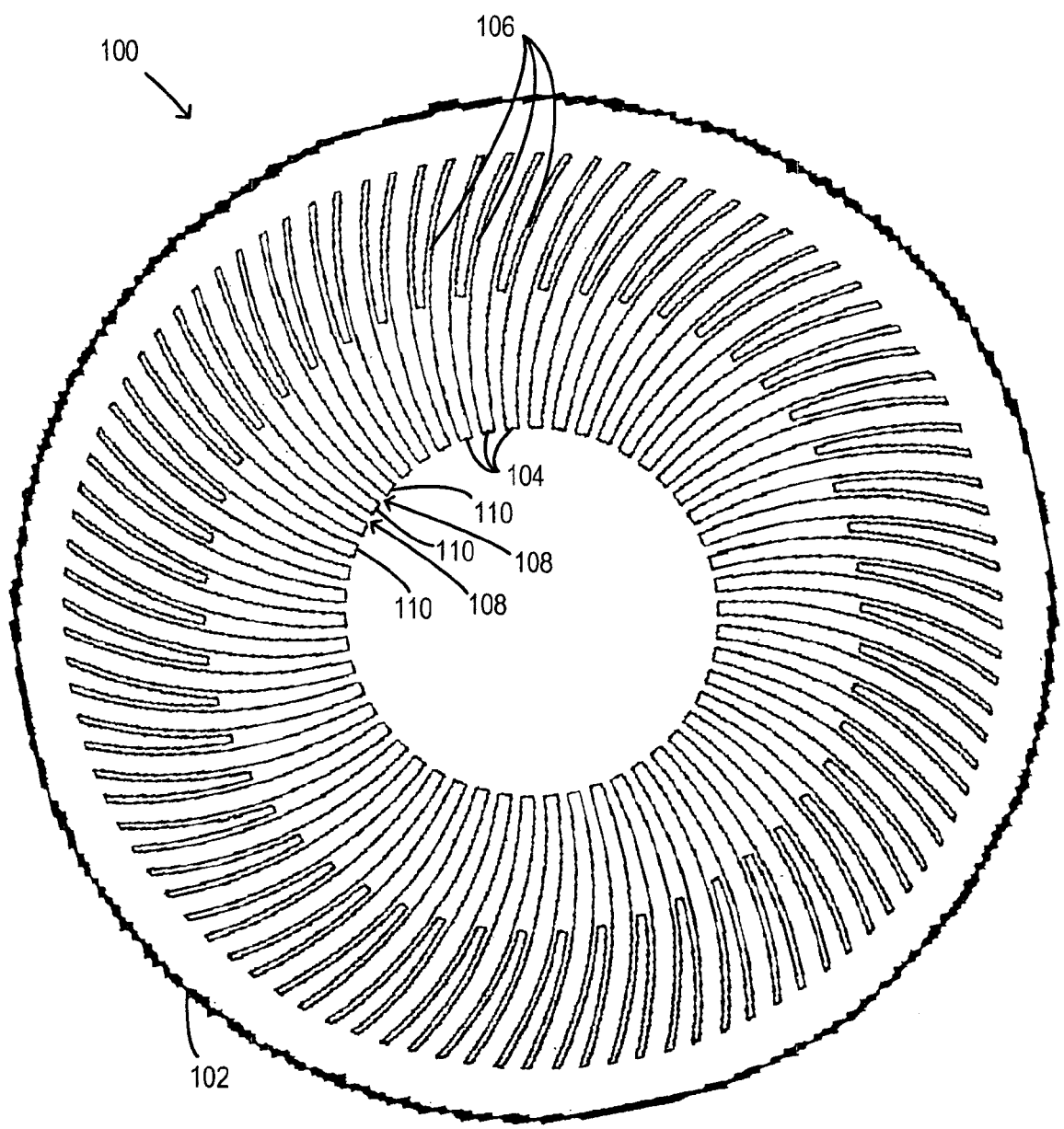
FIG. 3 is a plan view of an extrusion die provided according to some embodiments for manufacturing the heat sink of FIG. 1.

FIG. 3 is a plan view of an extrusion die 100 provided according to some embodiments for manufacturing the heat sink 10 of FIGS. 1 and 2. The extrusion die 100 includes a generally cylindrical collar 102 and a plurality of first tongues 104 which extend inwardly from the collar 102. The first tongues 104 may, for example, be curved, as illustrated in FIG. 4, and may be the same length as each other. The extrusion die 100 also includes a plurality of second tongues 106, which are shorter than the first tongues 104, extend inwardly from the collar 104, and are interspersed with the first tongues 104. For example, the first tongues 104 and the second tongues 106 may be arranged so that there is a second tongue 106 between every adjacent pair of first tongues 104, and so that there is a first tongue 104 between every adjacent pair of second tongues 106. The second tongues 106 may all be curved and may all be the same length as each other. As indicated above, the common length of the second tongues 106 may be shorter than the common length of the first tongues 104.

A function of the first tongues 104 is to define the inter-fin gaps 38 (FIG. 2) of the heat sink. A function of the second tongues 106 is to define the inter-tine gaps 40 of the heat sink. As will be appreciated from the above discussion of the heat sink, the ratio of the common length of the second tongues 106 to the common length of the first tongues 104 maybe in the range 0.3:1 to 0.7:1; in the example embodiment illustrated in FIG. 3, that ratio is substantially 0.5:1 so that the common length of the second tongues 106 is substantially one-half the common length of the first tongues 104.

As noted above in connection with the description of the heat sink, the roots 24 (FIG. 2) of the fins 14 of the heat sink are relatively thick. This design is advantageous relative to a process of extruding the heat sink, because the thickness of the roots 24 of the fins 14 corresponds to the width of channels 108 (FIG. 3) defined between ends 110 of the first tongues 104. Because the channels 108 are relatively wide, the pressure in the extruded material as it flows through the channels 108 is reduced, which reduces the force applied to the ends 110 of the first tongues 104, thereby reducing the risk of breaking the die 100.

In some embodiments, a process of forming the heat sink includes providing an extrusion die such as the die 100 of FIG. 3, and extruding a quantity of thermally conductive metal through the extrusion die. The metal may, for example, be aluminum. Alternatively the metal may be copper or any other suitable thermally conductive metal or metal alloy. Thus the heat sink of FIGS. 1 and 2 may be formed of the thermally conductive material as a unitary body.

FIG. 4 is a schematic, partially-exploded side view of an electronic system 200 according to some embodiments, which incorporates the heat sink of FIGS. 1 and 2.

The electronic system 200 may be, for example, a personal computer, and may include a conventional housing 202. The housing 202 may be in the shape of a conventional "mini-tower". The electronic system 200 also includes a substrate 204 mounted in the housing 202. The substrate 204 may be a conventional circuit board.

The electronic system 200 also includes an electronic component 206, which is mounted on the substrate 204, and which may be a conventional packaged IC. For example, the electronic component 206, may be a processor such as any type of computational circuit, including but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

The electronic system 200 also includes a heat sink 10, such as that illustrated in FIGS. 1 and 2, or as provided in accordance with other heat sink embodiments described hereinabove. The heat sink 10 may be mounted in the housing 202 and thermally coupled to the electronic component 206 in accordance with conventional practices.

The electronic system 200 may also include a fan 208, which may be positioned in the housing 202 so as to direct air to the heat sink 10.

The electronic system 200 may also include a number of other components which are not shown in the drawing. For example, the electronic system 200 may include a chip set and/or a communication circuit which may be functionally coupled to the electronic component 206 and which may be mounted on the substrate 204. Other components may also be mounted on the substrate 204 and/or functionally coupled to the electronic component 206. Among these may be a digital switching circuit, a radio frequency (RF) circuit, a memory circuit, a custom circuit, an application-specific integrated circuit (ASIC), an amplifier, and so forth. Other components (not shown) which may also be included in the electronic system 200 and mounted on the substrate 204 and/or in the housing 202 are an external memory in the form of one or more memory elements, such as RAM (random access memory) and/or ROM (read only memory), one or more hard drives and/or one or more drives that handle removable media such as floppy diskettes, compact disks (CDs), digital video disks (DVDs), and so forth. All of these components may be functionally coupled to the electronic component 206.

Still other components (not shown) may be included in the electronic system 200 but external to the housing 202, such as a display device, one or more speakers, and a keyboard and/or controller, which can include a mouse, trackball, game controller, speech recognition device or any other device that permits a user to input information into and/or receive information from the electronic system 200. Each of these devices, too, may be functionally coupled to the electronic component 206.

It should be understood that the electronic system 200 which incorporates the heat sink 10 need not be a personal computer, but may alternatively be a server computer or a game device, for example.

The split fin heat sink disclosed herein may be more efficient at heat dissipation than prior art heat sinks, including prior art heat sinks having straight fins that are split to an extent of about 20 percent or less of their length, with the split portion having a right-angle or "L" configuration to accommodate mounting of a fan.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method of forming a heat sink, comprising:
   providing an extrusion die that includes a plurality of first inwardly extending tongues all having a first length and a plurality of second inwardly extending tongues interspersed with the first tongues, and all having a second length that is shorter than the first length; and
   extruding a quantity of thermally conductive metal through the extrusion die;
   wherein:
      there is a respective one of said second tongues between each adjacent pair of said first tongues, and there is a respective one of said first tongues between each adjacent pair of said second tongues;
      said first length is measured with respect to each of the first tongues along the tongue from an outermost circumference of the die to a respective tip of the tongue; and
      said second length is measured with respect to each of the second tongues along the tongue from the outermost circumference of the die to a respective tip of the tongue.

2. The method of claim 1, wherein the first and second tongues are curved.

3. The method of claim 1, wherein a ratio of the second length to the first length is in the range 0.3:1 to 0.7:1.

4. The method of claim 3, wherein the second length is substantially one-half of the first length.

5. The method of claim 3, wherein the first and second tongues are curved.

6. The method of claim 1, wherein the metal includes aluminum.

7. The method of claim 1, wherein the plurality of second tongues includes at least 20 tongues having said second length.

8. The method of claim 1, wherein each of said first and second tongues has a concave surface.

9. A method of forming a heat sink, comprising:
   providing an extrusion die that includes a plurality of first inwardly extending tongues all having a first length and a plurality of second inwardly extending tongues interspersed with the first tongues, and all having a second length that is shorter than the first length; and
   extruding a quantity of thermally conductive metal through the extrusion die;
   wherein:
      the plurality of second tongues includes at least 20 tongues having said second length;
      said first length is measured with respect to each of the first tongues along the tongue from an outermost circumference of the die to a respective tip of the tongue; and
      said second length is measured with respect to each of the second tongues along the tongue from the outermost circumference of the die to a respective tip of the tongue.

10. The method of claim 9, wherein the first and second tongues are curved.

11. The method of claim 9, wherein a ratio of the second length to the first length is in the range 0.3:1 to 0.7:1.

12. The method of claim 11, wherein the second length is substantially one-half of the first length.

13. The method of claim 11, wherein the first and second tongues are curved.

14. The method of claim 8, wherein the metal includes aluminum.

15. The method of claim 9, wherein each of said first and second tongues has a concave surface.

16. A method of forming a heat sink, comprising:
   providing an extrusion die that includes a plurality of first inwardly extending tongues all having a first length and a plurality of second inwardly extending tongues interspersed with the first tongues, and all having a second length that is shorter than the first length; and
   extruding a quantity of thermally conductive metal through the extrusion die;
   wherein:
      none of said tongues has a straight side that faces an adjacent tongue;

said first length is measured with respect to each of the first tongues along the tongue from an outermost circumference of the die to a respective tip of the tongue; and said second length is measured with respect to each of the second tongues along the tongue from the outermost circumference of the die to a respective tip of the tongue.

17. The method of claim 16, wherein the first and second tongues are curved.

18. The method of claim 16, wherein a ratio of the second length to the first length is in the range 0.3:1 to 0.7:1.

19. The method of claim 16, wherein the second length is substantially one-half of the first length.

20. The method of claim 16, wherein the first and second tongues are curved.

21. The method of claim 16, wherein the metal includes aluminum.

22. The method of claim 16, wherein each of said first and second tongues has a concave surface.

* * * * *